United States Patent
Kojima (10) Patent No.: US 8,581,664 B2
(45) Date of Patent: Nov. 12, 2013

(54) PULSE ELECTRIC POWER AMPLIFICATION APPARATUS

(75) Inventor: Haruo Kojima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 13/331,492

(22) Filed: Dec. 20, 2011

(65) Prior Publication Data

US 2012/0268209 A1 Oct. 25, 2012

(30) Foreign Application Priority Data

Apr. 25, 2011 (JP) ................. 2011-096855

(51) Int. Cl.
*H03G 9/00* (2006.01)
*H03F 3/04* (2006.01)
*H03F 3/72* (2006.01)

(52) U.S. Cl.
CPC ..................... *H03F 3/72* (2013.01)
USPC .......................... 330/133; 330/289

(58) Field of Classification Search
USPC ............ 330/133, 126, 281, 284, 289
See application file for complete search history.

(56) References Cited

U.S. PATENT DOCUMENTS 7,123,089 B2 * 10/2006 Kojima .............. 330/133

FOREIGN PATENT DOCUMENTS

| JP | 2001-284995 | 10/2001 |
|---|---|---|
| JP | 2005-151442 | 6/2005 |
| JP | 2008-193720 | 8/2008 |
| JP | 2009-010910 | 1/2009 |

OTHER PUBLICATIONS

Japanese Office Action mailed Apr. 16, 2013 in Japanese Patent Application No. 2011-096855 filed Apr. 25, 2011 (with English Translation).

* cited by examiner

*Primary Examiner* — Robert Pascal
*Assistant Examiner* — Khiem Nguyen
(74) *Attorney, Agent, or Firm* — Oblon, Spivak, McClelland, Maier & Neustadt, L.L.P.

(57) ABSTRACT

A pulse electric power amplification apparatus includes first, second, final-stage and drive amplification devices. In initial stage, the first device in upstream, having a predetermined thermal time constant, receives a high frequency signal while the second device in downstream, having a different thermal time constant, is cascade-connected to it. In final stage, the drive device drives the final-stage device in downstream, which is cascade-connected to the second device. The apparatus further includes a power supply switching circuit, first and second differentiating circuits. The first and second differentiating circuits, having time constants corresponding to thermal time constants of the first and second devices, respectively, receive a pulse signal with which the high frequency signal is modulated. The power supply switching circuit, also receiving the pulse signal, switches a voltage outputted from a positive bias power supply and inputs the switched voltage to the first, second, drive and final-stage devices.

21 Claims, 5 Drawing Sheets

FIG. 1

Related Art

PULSE ELECTRIC POWER AMPLIFICATION APPARATUS

CROSS-REFERENCE TO RELATED APPLICATION

This application claims benefit of priority of Japanese Patent Application No. 2011-096855 filed on Apr. 25, 2011. The contents of the Japanese application are incorporated into the present application by reference.

FIELD

An embodiment relates to a pulse electric power amplification apparatus used in a transmission system for a pulse radar and the like.

BACKGROUND

A pulse electric power amplification device is known. The pulse electric power amplification device includes, for example, a plurality of field-effect transistors (hereinafter referred to as FETs) used as electric power amplification elements cascade-connected in multiple stages.

Figure 1:
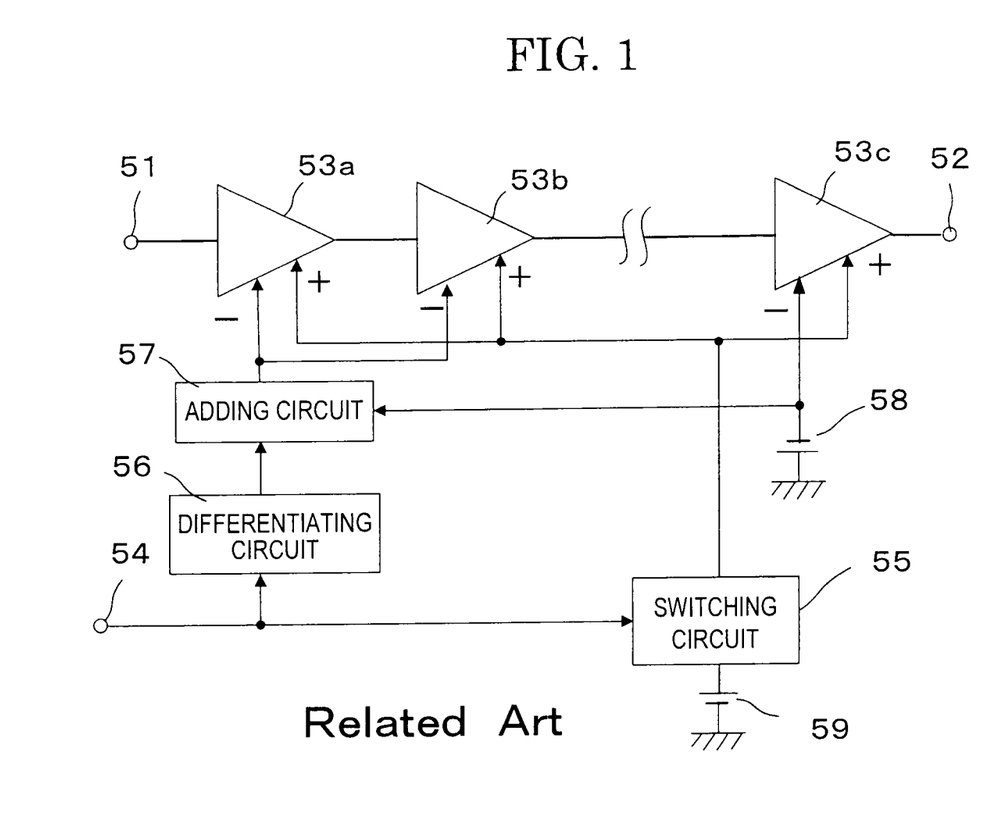
FIG. 1 is a figure illustrating an example of configuration of a conventional pulse electric power amplification device.

FIG. 1 illustrates an example of a pulse electric power amplification device having this configuration. For example, an initial stage amplification device 53a, a second stage amplification device 53b, and a final stage amplification device 53c constituted of FETs are cascade-connected between an input terminal 51 and an output terminal 52. A switching circuit 55 switches a positive bias power supply 59 with a modulation pulse applied to a pulse input terminal 54, and supplies the result to amplification devices 53a, 53b, 53c as a positive operation power supply voltage. The modulation pulse received by the pulse input terminal 54 is also supplied to a differentiating circuit 56.

The differentiating circuit 56 differentiates a leading edge of the modulation pulse with a predetermined time constant, and gives a differentiation signal to an adding circuit 57. The adding circuit 57 adds the differentiation signal supplied by the differentiating circuit 56 to a negative bias voltage supplied by a negative bias power supply 58, and supplies the result to each amplification device other than the final stage amplification device 53c as an input side negative bias voltage. The voltage of the negative bias power supply 58 is simply supplied to the negative bias voltage terminal at the input side of the final stage amplification device 53c.

When this pulse electric power amplification device receives a high frequency signal serving as an original signal of a transmission pulse received from the input terminal 51, the amplification devices 53a, 53b amplify the pulse within a time corresponding to a pulse width received from the pulse input terminal 54, and this increases the channel temperature of each amplification device, and the amplification gain decreases according to a predetermined thermal time constant. A signal differentiated with the thermal time constant is given from the differentiating circuit 56 to the adding circuit 57, in which the signal is added to the negative bias voltage, and the result is supplied to the amplification devices 53a, 53b other than the device in the final stage. In this manner, change of the amplification gain in a pulse over time is compensated in each amplification device.

When the power supply of the amplification device is supplied as a pulse wave in the pulse amplification apparatus, and the semiconductor devices of the same type are used as the amplification elements of the respective amplification devices, the amplification elements have almost the same thermal time constant, and therefore, change of the amplification gain over time can be compensated using a differentiating circuit having the same time constant.

By the way, a pulse amplification apparatus attracts attention. In this pulse amplification apparatus, GaAs is used in the upstream stage of the initial stage, and GaN is used in the downstream stage thereof, or SiGe is used in the upstream stage, and GaAs is used in the downstream stage, as amplification elements of respective amplification devices in order to achieve high output and high efficiency at the same time. The amplification device using GaAs, GaN, SiGe as the amplification elements have different thermal time constants at which the amplification gains decrease, which cannot be compensated with the same differentiating circuit.

In the pulse amplification apparatus in which the amplification devices using the different semiconductor devices in the upstream stage and the downstream stage of the initial stage unit are cascade-connected as described above, thermal time constants of these amplification devices are different. In this case, change of the amplification gain over time as shown in FIG. 1 cannot be compensated, and the phase change within a pulse deteriorates, which makes it impossible to obtain the pulse amplification apparatus having highly linear amplification characteristics.

The present invention provides a pulse amplification apparatus in which amplification devices using semiconductor devices having different properties in an upstream stage and a downstream stage of an initial stage unit are cascade-connected as described above, wherein change of an amplification gain over time with a thermal time constant can be compensated, so that the pulse amplification apparatus has high degree of linearity.

DETAILED DESCRIPTION

An embodiment provides a pulse electric power amplification apparatus including a first amplification device receiving a high frequency signal in an upstream stage in an initial stage unit and having a predetermined thermal time constant concerning an amplification gain, a second amplification device in a downstream stage cascade-connected to the first amplification device and having a thermal time constant different from that of the first amplification device, a final stage amplification device cascade-connected in a final stage downstream of the second amplification device, a drive amplification device cascade-connected in an upstream stage with respect to the final stage amplification device and driving the final stage amplification device, a power supply switching circuit receiving a pulse signal with which the high frequency signal is modulated and switching an output voltage given by a positive bias power supply, wherein the power supply switching circuit supplies the switched output voltage to positive bias power supply terminals at input sides of the first amplification device, the second amplification device, the drive amplification device, and the final stage amplification device, a first differentiating circuit receiving the pulse signal and having a time constant corresponding to the thermal time constant of the first amplification device, a second differentiating circuit receiving the pulse signal and having a time constant corresponding to thermal time constant of the second amplification device, a negative bias power supply outputting a negative bias voltage supplied to negative bias terminals at input sides of the drive circuit and the final stage amplification device, a first adding circuit adding the negative bias voltage given by the negative bias power supply and the output given by the first differentiating circuit and supplying a result to a negative bias terminal at an input side of the first amplification device, and a second adding circuit adding the negative bias voltage given by the negative bias power supply and the output given by the second differentiating circuit and supplying a result to a negative bias terminal at an input side of the second amplification device.

Hereinafter, embodiments will be explained with reference to drawings.

<First Embodiment>

Figure 2:
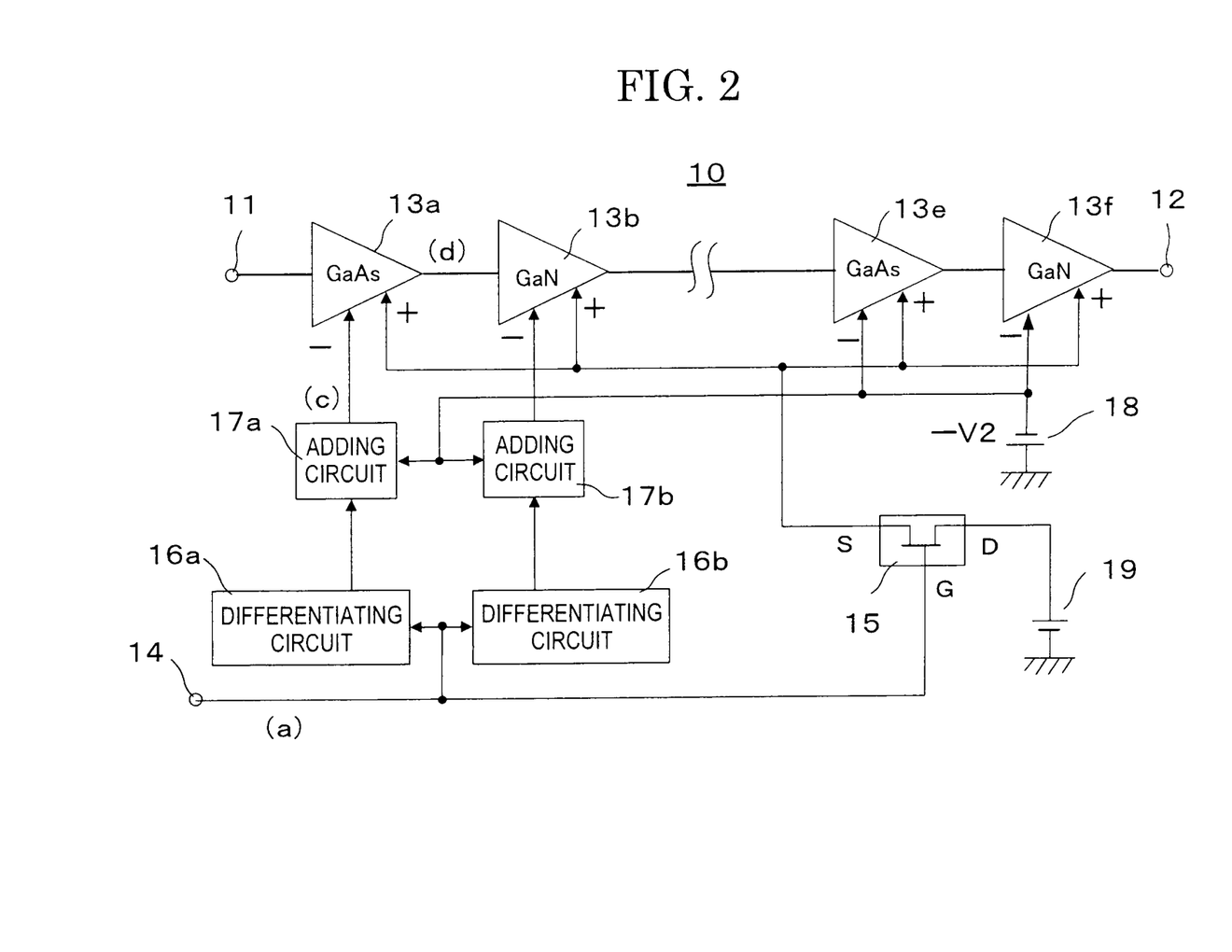
FIG. 2 is a figure illustrating an example of configuration of the first embodiment.

FIG. 2 illustrates a configuration of the first embodiment. In the pulse amplification apparatus according to this embodiment, amplification elements include a GaAs (gallium arsenide) FET used as a distributed amplification device in an upstream stage of an initial stage unit and a GaN (gallium nitride) FET used as a distributed amplification device in a downstream stage thereof.

A plurality of amplification devices are cascade-connected between a high frequency input terminal 11 and a high frequency output terminal 12 of a pulse amplification apparatus 10. More specifically, the pulse amplification apparatus 10 includes a distributed amplification device 13a in the upstream stage of the initial stage unit whose input terminal is connected to the high frequency input terminal 11, a distributed amplification device 13b in the downstream stage thereof whose input terminal is connected to the output terminal of the distributed amplification device 13a, a cascade-connected drive amplification device 13e, and an amplification device 12f in the final stage whose input terminal is connected to the output terminal of the amplification device 13e and whose output terminal is connected to the high frequency output terminal 12.

The distributed amplification device 13a uses GaAs as the amplification element. The distributed amplification device 13b uses GaN as the amplification element. The final stage amplification device 13f uses GaN as the amplification element. The drive amplification device 13e before the final stage amplification device 13f uses GaAs as the amplification element. The drive amplification device 13e is an amplification device for driving the final stage amplification device 13f.

In some cases, one or more amplification devices using GaAs as amplification elements may be connected between the distributed amplification device 13b and the drive amplification device 13e.

For example, these amplification devices include FETs, and are cascade-connected using a gate electrode as an input terminal, a drain electrode as an output terminal, and a source electrode as a common terminal. These amplification devices have a positive bias terminal and a negative bias terminal at the input side.

For example, a pulse input terminal 14 receiving a pulse signal is connected to a gate (G) of a power supply switching circuit 15 and differentiating circuits 16a, 16b. The output terminals of these differentiating circuits 16a, 16b are connected to input terminals of adding circuits 17a, 17b. The outputs of the adding circuits 17a, 17b are given to the negative bias terminals of the distributed amplification devices 13a, 13b.

The negative bias power supply 18 whose positive terminal is grounded is connected to the input terminals of the adding circuits 17a, 17b and the negative bias terminals at the input sides of the drive amplification device 13e and the final stage amplification device 13f.

The positive bias power supply 19 whose negative terminal is grounded is connected to a drain terminal D of the power supply switching circuit 15. A source terminal S is connected to the positive bias terminals at the input sides of the distributed amplification devices 13a, 13b, the drive amplification device 13e, and the final stage amplification device 13f.

The differentiating circuit 16a is adjusted to have a time constant corresponding to a thermal time constant of reduction of the amplification gain of the distributed amplification device 13a in the upstream stage of the initial stage unit using GaAs as the amplification element. On the other hand, the differentiating circuit 16b is adjusted to have a time constant corresponding to a thermal time constant of reduction of the amplification gain of the distributed amplification device 13a in the downstream stage of the initial stage unit using GaN as the amplification element. By advancing the phase of the distributed amplification device 13a, the delay of the phase by the drive amplification device 13e can be compensated. On the other hand, by advancing the phase of the distributed amplification device 13b, the delay of the phase by the final stage amplification device 13f can be compensated.

The gain of the amplification device decreases due to the characteristics of the amplification elements. The gain is decreased due to thermal time constants of the amplification devices by the amplification elements.

Figure 3:
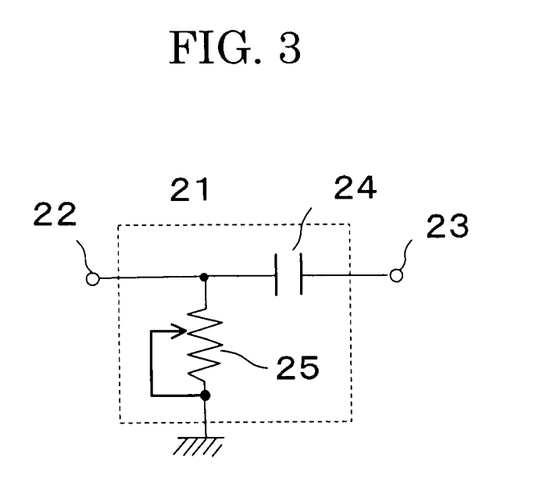
FIG. 3 is a figure illustrating an example of a differentiating circuit and an adding circuit according to the first embodiment.

FIG. 3 shows an example of circuit of a differentiating/adding circuit in which the differentiating circuit 16a and the adding circuit 17a are combined. This differentiating/adding circuit 21 includes a capacitor 24 connected between the input terminal 22 and the output terminal 23 and a variable resistor 25 whose end is connected to the input terminal 22 and whose other end is grounded. In this manner, in practice, the differentiating circuit and the adding circuit may be integrally made. A differentiating/adding circuit 25 (not shown) made by combining the differentiating circuit 16b and the adding circuit 17b also has the same configuration.

However, thermal time constant of reduction of the amplification gain of the distributed amplification device 13a using GaAs as the amplification element is about 50 to 200 μs, and the value of the variable resistor 24 is adjusted so that the product of the variable resistor 24 and the capacitor 24 of the differentiating/adding circuit 24 becomes almost equal to this.

On the other hand, thermal time constant of reduction of the amplification gain of the distributed amplification device 13b using GaN as the amplification element is about 5 to 30 μs, and the value of the variable resistor of the differentiating/adding circuit 25 connected to the negative bias terminal at the input side of the distributed amplification device 13b is adjusted so that the product of the variable resistor and the capacitor of the differentiating/adding circuit 25 connected to the negative bias terminal at the input side of the distributed amplification device 13b becomes almost equal to this.

Subsequently, operation of this embodiment will be explained. The power supply switching circuit 15 switches the positive bias power supply 19 with a modulation pulse applied to the pulse input terminal 14, and supplies the positive bias voltage to the positive bias terminals at the input sides of the distributed amplification device 13a, the distributed amplification device 13b, the drive amplification device 13e, and the final stage amplification device 13f.

The negative bias voltage output from the negative bias power supply 18 is directly supplied to the negative bias terminals of the amplification devices other than the initial stage unit. The outputs of the adding circuits 17a, 17b are supplied to the negative bias input terminals of the distributed amplification devices 13a, 13b of the initial stage unit, respectively.

A high frequency signal serving as a source signal of a transmission pulse is input to the high frequency signal input terminal 11. The distributed amplification device 13a and the distributed amplification device 13b are different in thermal time constants, and accordingly the differentiating circuit 16a and the differentiating circuit 16b are different only in the time constants. That is, the overall operation of the distributed amplification device 13a and the distributed amplification device 13b are the same. Therefore, only the distributed amplification device 13a, the differentiating circuit 16a, and the adding circuit 17a will be explained.

It should be noted that adjusting the time constant of the differentiating circuit 16a according to thermal time constant of reduction of the amplification gain of the distributed amplification device 13a is equivalent to, in terms of phase, compensating the delay of the phase of the drive amplification device 13e in the downstream stage by advancing the phase in the distributed amplification device 13a. In this explanation, we focus on the phase.

Figure 4:
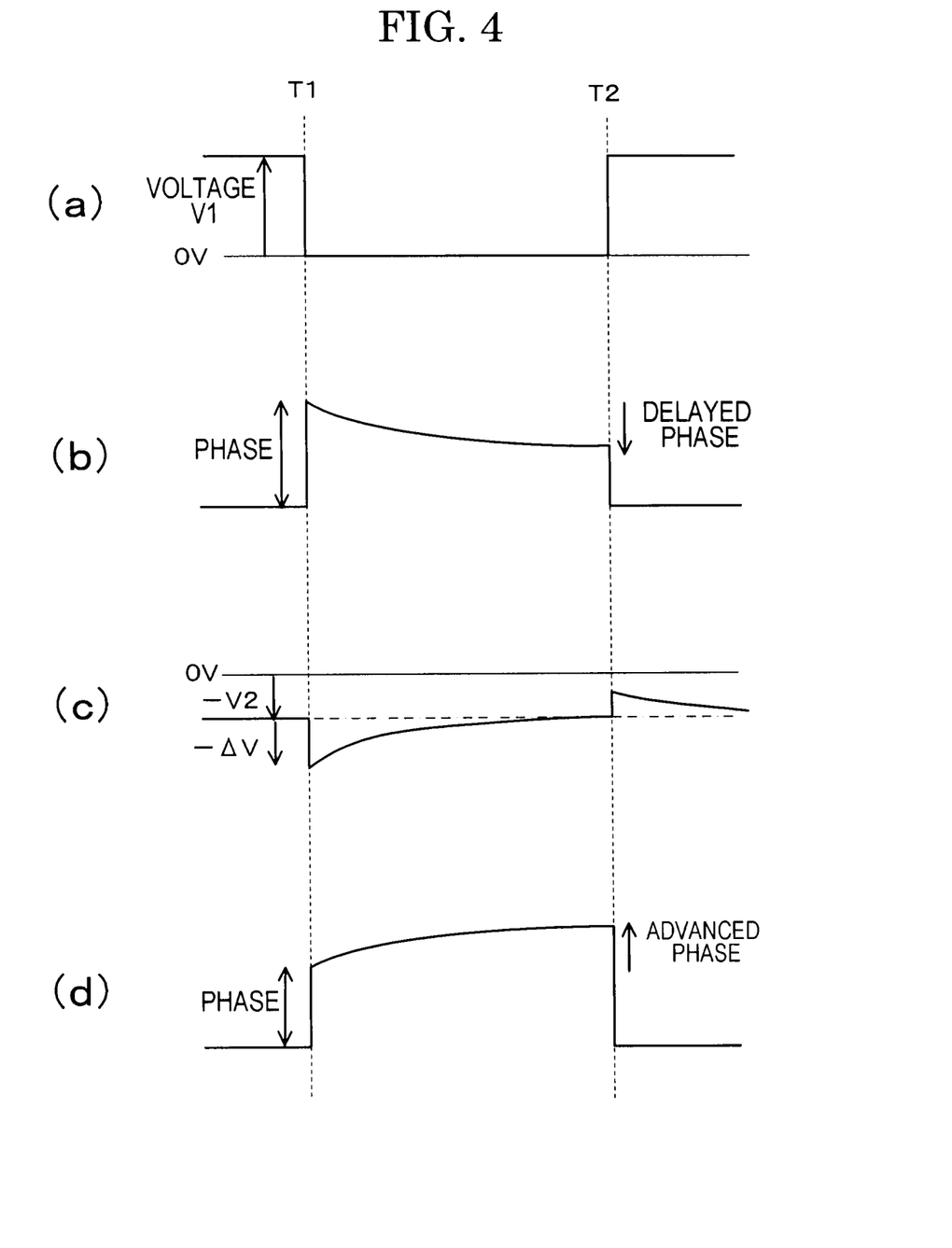
FIG. 4 is a wave form chart for explaining operation of the first embodiment.

FIG. 4(a) illustrates an entire waveform of a modulation pulse signal given to the pulse input terminal 14. When this kind of modulation pulse is input to the pulse input terminal 14, the modulation pulse is transmitted to the power supply switching circuit 15 and the differentiating circuit 16a. The FET of the power supply switching circuit 15 becomes conductive, and by switching the positive bias power supply with this modulation pulse, the FET of the power supply switching circuit 15 passes the voltage of the positive bias power supply 19 and supplies the voltage to the positive bias terminal of each amplification device for a period corresponding to a pulse width from a time point T1 to a time point T2. It is assumed that a predetermined negative bias voltage is supplied in the period of the pulse width. In the distributed amplification device 13a, the channel temperature of the FET rises from the time point T1, and the phase is delayed with thermal time constant corresponding to the amplification element GaAs as shown in FIG. 4(b), which reduces the amplification gain.

However, as shown in FIG. 4(c), a voltage (−V2−ΔV) obtained by adding a negative bias voltage (−V2) supplied from the negative bias power supply and a voltage ΔV differentiated by the differentiating circuit 16a is input to the negative bias terminal at the input side of the distributed amplification device 13a.

Therefore, as shown in FIG. 4(d), the distributed amplification device 13a can advance the phase within 1 pulse. As a result, the delay of the phase of the drive amplification device 13e subsequent to the downstream stage of the amplification device 13b can be cancelled in principle.

Likewise, in the amplification device 13b, the amplification gain decreases due to thermal time constant from the time point T1, which causes delay in the phase, but the differentiating circuit 16b and the adding circuit 17b provide a negative bias voltage having a phase advanced as shown in FIG. 4(d) to the negative bias terminal of the distributed amplification device 13b, so that the delay of the phase of the final stage amplification device 13f can be cancelled in principle.

Therefore, in the cascade-connected pulse amplification apparatus, having GaAs as the amplification element in the upstream stage distributed amplification device in the initial stage, GaN as the amplification element in the downstream stage distributed amplification device in the initial stage, GaAs as the amplification element in the drive amplification device, and GaN as the amplification element in the final stage amplification device, phase change within one pulse can be reduced, and high degree of linearity can be obtained.

In the above embodiment, the pulse amplification apparatus made by cascade-connecting the amplification device having GaAs and the amplification device having GaN as the amplification elements has been explained. However, the present invention can also be applied to a pulse amplification apparatus made by cascade-connecting an amplification device having SiGe and an amplification device having GaAs as amplification elements.

<Second Embodiment>

Figure 5:
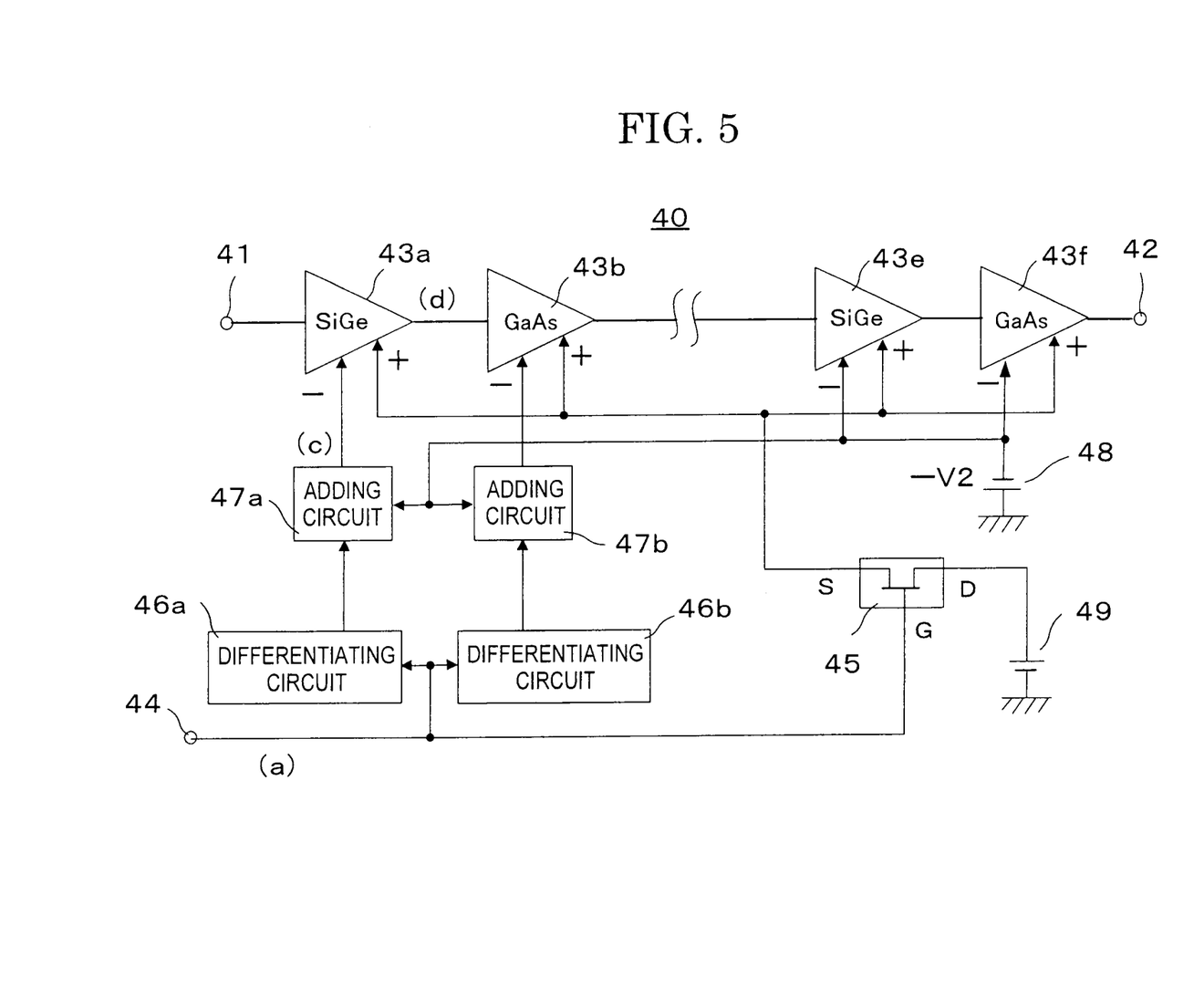
FIG. 5 is a figure illustrating an example of configuration of the second embodiment.

FIG. 5 illustrates an example of configuration of the second embodiment. In a pulse amplification apparatus according to this embodiment, amplification elements in an initial stage unit include SiGe (silicon germanium) used as a distributed amplification device in an upstream stage and GaAs (gallium arsenide) used as a distributed amplification device in a downstream stage.

A plurality of amplification devices are cascade-connected between a high frequency input terminal 41 and a high frequency output terminal 42 of a pulse amplification apparatus 40. More specifically, the pulse amplification apparatus 40 includes a distributed amplification device 43a in the upstream stage of the initial stage unit whose input terminal is connected to the high frequency input terminal 41, a distributed amplification device 43b in the downstream stage whose input terminal is connected to the output terminal of the distributed amplification device 43a, a cascade-connected drive amplification device 43e, and an amplification device 42f in the final stage whose input terminal is connected to the output terminal of the amplification device 43e and whose output terminal is connected to the high frequency output terminal 42.

The distributed amplification device 43a in the upstream stage of the initial stage unit uses SiGe as the amplification element. The distributed amplification device 43b in the downstream stage thereof uses GaAs as the amplification element. The final stage amplification device 43f uses GaAs as the amplification element. The drive amplification device 43e before the final stage amplification device 43f uses SiGe as the amplification element. The drive amplification device 43e is an amplification device for driving the final stage amplification device 43f.

In some cases, one or more amplification devices using SiGe as amplification elements may be connected between the distributed amplification device 43b and the drive amplification device 43e.

For example, these amplification devices include FETs, and are cascade-connected using a gate electrode as an input terminal, a drain electrode as an output terminal, and a source electrode as a common terminal. These amplification devices have a positive bias terminal and a negative bias terminal at the input side.

For example, a pulse input terminal 44 receiving a pulse signal is connected to a gate (G) of a power supply switching circuit 45 and differentiating circuits 46a, 46b. The output terminals of these differentiating circuits 46a, 46b are connected to input terminals of adding circuits 47a, 47b. The outputs of the adding circuits 47a, 47b are given to the negative bias terminals of the distributed amplification devices 43a, 43b.

The negative bias power supply 48 whose positive terminal is grounded is connected to the input terminals of the adding circuits 47a, 47b and the negative bias terminals at the input sides of the drive amplification device 43e and the final stage amplification device 43f.

The positive bias power supply 49 whose negative terminal is grounded is connected to a drain terminal D of the power supply switching circuit 45. A source terminal S is connected to the positive bias terminals at the input sides of the distributed amplification devices 43a, 43b, the drive amplification device 43e, and the final stage amplification device 43f.

In this embodiment, the time constant of the differentiating circuit 46a is adjusted according to thermal time constant of reduction of the amplification gain of the distributed amplification device 43a using SiGe as the amplification element. The time constant of the differentiating circuit 46b is adjusted according to thermal time constant of reduction of the amplification gain of the distributed amplification device 43a using SiGe as the amplification element.

As a result, by advancing the phase of the distributed amplification device 43a, the delay of the phase by the drive amplification device 43e can be compensated. On the other hand, by advancing the phase of the distributed amplification device 43b, the delay of the phase by the final stage amplification device 43f can be compensated.

<Other Modifications>

In the above embodiment, the use of the distributed amplification devices in the upstream stage and the downstream stage of the initial stage unit has been explained. However, the present invention can also be applied to non-distributed amplification devices in the upstream stage and the downstream stage of the initial stage unit.

In the above embodiment, the pulse amplification apparatus in which GaAs is used as the amplification device in the upstream stage of the initial stage unit and GaN is used as the amplification device in the downstream stage thereof as the amplification elements, and the pulse amplification apparatus in which SiGe is used as the amplification device in the upstream stage of the initial stage unit and GaAs is used as the amplification device in the downstream stage thereof as the amplification elements. However, the present invention is not limited thereto. The present invention can be applied to a pulse electric power amplification device made by cascade-connecting amplification devices using different amplification element in an upstream stage and a downstream stage of an initial stage unit.

According to the above embodiments and modifications, the pulse amplification apparatus in which amplification devices using the semiconductor devices having different properties in the upstream stage and the downstream stage of the initial stage unit are cascade-connected, wherein change of the amplification gain over time with thermal time constant can be compensated, so that the pulse amplification apparatus has high degree of linearity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pulse electric power amplification apparatus comprising:
    a first amplification device receiving a high frequency signal in an upstream stage in an initial stage unit and having a predetermined thermal time constant concerning an amplification gain;
    a second amplification device in a downstream stage cascade-connected to the first amplification device and having a thermal time constant different from that of the first amplification device;
    a final stage amplification device cascade-connected in a final stage downstream of the second amplification device;
    a drive amplification device cascade-connected in an upstream stage with respect to the final stage amplification device and driving the final stage amplification device;
    a power supply switching circuit receiving a pulse signal with which the high frequency signal is modulated, and switching an output voltage given by a positive bias power supply, wherein the power supply switching circuit supplies the switched output voltage to positive bias power supply terminals at input sides of the first amplification device, the second amplification device, the drive amplification device, and the final stage amplification device;
    a first differentiating circuit receiving the pulse signal and having a time constant corresponding to the thermal time constant of the first amplification device;
    a second differentiating circuit receiving the pulse signal and having a time constant corresponding to thermal time constant of the second amplification device;
    a negative bias power supply outputting a negative bias voltage supplied to negative bias terminals at input sides of the drive circuit and the final stage amplification device;
    a first adding circuit adding the negative bias voltage given by the negative bias power supply and the output given by the first differentiating circuit and supplying a result to a negative bias terminal at an input side of the first amplification device; and
    a second adding circuit adding the negative bias voltage given by the negative bias power supply and the output given by the second differentiating circuit and supplying a result to a negative bias terminal at an input side of the second amplification device.

2. The pulse electric power amplification apparatus according to claim 1, wherein the first amplification device in the upstream stage of the initial stage unit and the drive amplification device include a first amplification element of a same type, and
    the second amplification device in the downstream stage of the initial stage unit and the final stage amplification device include a second amplification element of a same type which is different from the first amplification element.

3. The pulse electric power amplification apparatus according to claim 2, wherein the first amplification device in the upstream stage of the initial stage unit and the second amplification device in the downstream stage of the initial stage unit are distributed amplification devices.

4. The pulse electric power amplification apparatus according to claim 2, wherein an amplification device using an amplification element of the same type as that of the first amplification device is cascade-connected between the second amplification device in the downstream stage of the initial stage unit and the drive amplification device.

5. The pulse electric power amplification apparatus according to claim 3, wherein an amplification device using an amplification element of the same type as that of the first amplification device is cascade-connected between the second amplification device in the downstream stage of the initial stage unit and the drive amplification device.

6. The pulse electric power amplification apparatus according to claim 2, wherein the first amplification device in the upstream stage of the initial stage unit uses GaAs as an amplification element, and the second amplification device in the downstream stage of the initial stage unit uses GaN as an amplification element.

7. The pulse electric power amplification apparatus according to claim 3, wherein the first amplification device in the upstream stage uses GaAs as an amplification element, and the second amplification device in the downstream stage uses GaN as an amplification element.

8. The pulse electric power amplification apparatus according to claim 4, wherein the first amplification device in the upstream stage uses GaAs as an amplification element, and the second amplification device in the downstream stage uses GaN as an amplification element.

9. The pulse electric power amplification apparatus according to claim 5, wherein the first amplification device in the upstream stage uses GaAs as an amplification element, and the second amplification device in the downstream stage uses GaN as an amplification element.

10. The pulse electric power amplification apparatus according to claim 2, wherein an amplification device using an amplification element of the same type as that of the first amplification device is cascade-connected between the second amplification device in the downstream stage and the drive amplification device.

11. The pulse electric power amplification apparatus according to claim 2, wherein the first amplification device in the upstream stage uses SiGe as an amplification element, and the second amplification device in the downstream stage uses GaAs as an amplification element.

12. The pulse electric power amplification apparatus according to claim 3, wherein the first amplification device in the upstream stage uses SiGe as an amplification element, and the second amplification device in the downstream stage uses GaAs as an amplification element.

13. The pulse electric power amplification apparatus according to claim 4, wherein the first amplification device in the upstream stage uses SiGe as an amplification element, and the second amplification device in the downstream stage uses GaAs as an amplification element.

14. A pulse electric power amplification apparatus comprising:
    a first amplification device receiving a high frequency signal in an upstream stage in an initial stage unit and having a predetermined thermal time constant concerning an amplification gain, the first amplification device being a distributed amplification device;
    a second amplification device in a downstream stage cascade-connected to the first amplification device and having a thermal time constant different from that of the first amplification device, the second amplification device being a distributed amplification device;
    a final stage amplification device cascade-connected in a final stage downstream of the second amplification device;
    a drive amplification device cascade-connected in an upstream stage with respect to the final stage amplification device and driving the final stage amplification device;
    a power supply switching circuit receiving a pulse signal with which the high frequency signal is modulated and switching an output voltage given by a positive bias power supply, wherein the power supply switching circuit supplies the switched output voltage to positive bias power supply terminals at input sides of the first amplification device, the second amplification device, the drive amplification device, and the final stage amplification device;
    a first differentiating circuit receiving the pulse signal and having a time constant corresponding to the thermal time constant of the first amplification device;
    a second differentiating circuit receiving the pulse signal and having a time constant corresponding to thermal time constant of the second amplification device;
    a negative bias power supply outputting a negative bias voltage supplied to negative bias terminals at input sides of the drive circuit and the final stage amplification device;
    a first adding circuit adding the negative bias voltage given by the negative bias power supply and the output given by the first differentiating circuit and supplying a result to a negative bias terminal at an input side of the first amplification device; and
    a second adding circuit adding the negative bias voltage given by the negative bias power supply and the output given by the second differentiating circuit and supplying a result to a negative bias terminal at an input side of the second amplification device.

15. The pulse electric power amplification apparatus according to claim 14, wherein an amplification device using an amplification element of the same type as that of the first amplification device is cascade-connected between the second amplification device in the downstream stage of the initial stage unit and the drive amplification device.

16. The pulse electric power amplification apparatus according to claim 14, wherein the first amplification device in the upstream stage of the initial stage unit and the drive amplification device include a first amplification element of a same type, and
    the second amplification device in the downstream stage of the initial stage unit and the final stage amplification device include a second amplification element of a same type which is different from the first amplification element.

17. The pulse electric power amplification apparatus according to claim 15, wherein the first amplification device in the upstream stage of the initial stage unit and the drive amplification device include a first amplification element of a same type, and
    the second amplification device in the downstream stage of the initial stage unit and the final stage amplification device include a second amplification element of a same type which is different from the first amplification element.

18. The pulse electric power amplification apparatus according to claim 16, wherein the first amplification device in the upstream stage of the initial stage unit uses GaAs as an amplification element, and the second amplification device in the downstream stage of the initial stage unit uses GaN as an amplification element.

19. The pulse electric power amplification apparatus according to claim 17, wherein the first amplification device in the upstream stage of the initial stage unit uses GaAs as an amplification element, and the second amplification device in the downstream stage of the initial stage unit uses GaN as an amplification element.

20. The pulse electric power amplification apparatus according to claim 16, wherein the first amplification device in the upstream stage of the initial stage unit uses SiGe as an amplification element, and the second amplification device in the downstream stage of the initial stage unit uses GaAs as an amplification element.

21. The pulse electric power amplification apparatus according to claim 17, wherein the first amplification device in the upstream stage of the initial stage unit uses SiGe as an amplification element, and the second amplification device in the downstream stage of the initial stage unit uses GaAs as an amplification element.

* * * * *